United States Patent [19]
Chen et al.

[11] Patent Number: 6,102,499
[45] Date of Patent: Aug. 15, 2000

[54] MOUNTING BRACKET FOR DATA PROCESSING DEVICE

[75] Inventors: I-Fee Chen, Chung-Li; Alvin Liu, Taipei Hsien, both of Taiwan

[73] Assignee: Hon Hai Precision Ind. Co., Ltd., Taipei Hsien, Taiwan

[21] Appl. No.: 09/126,623

[22] Filed: Jul. 30, 1998

[30] Foreign Application Priority Data

Jan. 17, 1998 [TW] Taiwan ................................. 87200885

[51] Int. Cl.⁷ .................................................. H05K 7/18
[52] U.S. Cl. ...................... 312/223.2; 312/218; 312/333; 292/106
[58] Field of Search .................................... 361/725, 726, 361/727; 364/708.1; 248/222.51, 680; 292/106, 31, 101, DIG. 68; 312/223.2, 223.1, 332.1, 333, 334.13, 216, 218, 350, 330.1; 439/377; 211/26

[56] References Cited

U.S. PATENT DOCUMENTS

| | | | |
|---|---|---|---|
| 4,754,397 | 6/1988 | Varaiya et al. | 364/708.1 X |
| 4,804,824 | 2/1989 | Saguchi | 312/333 X |
| 5,123,721 | 6/1992 | Seo | 312/333 |
| 5,142,447 | 8/1992 | Cooke et al. | |
| 5,174,539 | 12/1992 | Leonard | |
| 5,682,291 | 10/1997 | Jeffries et al. | 312/223.2 X |
| 5,734,557 | 3/1998 | McAnally et al. | 361/727 |
| 5,841,631 | 11/1998 | Shin et al. | 361/726 X |

*Primary Examiner*—Janet M. Wilkens

[57] ABSTRACT

A mounting bracket for removably attaching a data processing device to a cage of a computer housing comprises a base plate forming a first sidewall and a second sidewall spaced apart from the first sidewall. Both sidewalls extend vertically from transverse sides of the base plate. The first and second sidewalls define a receiving space for receiving a data processing device therein. The first sidewall includes a biasing flange extending horizontally into the receiving space from a free end thereof, and the second sidewall includes at least a biasing tab extending toward the receiving space thereby facilitating the installation of the data processing device within the receiving space.

15 Claims, 13 Drawing Sheets

MOUNTING BRACKET FOR DATA PROCESSING DEVICE

FIELD OF THE INVENTION

The present invention relates to a mounting bracket, and more particularly to a mounting bracket device for removably attaching of a data processing device to a cage of a computer housing.

DESCRIPTION OF THE PRIOR ART

Figure 1:
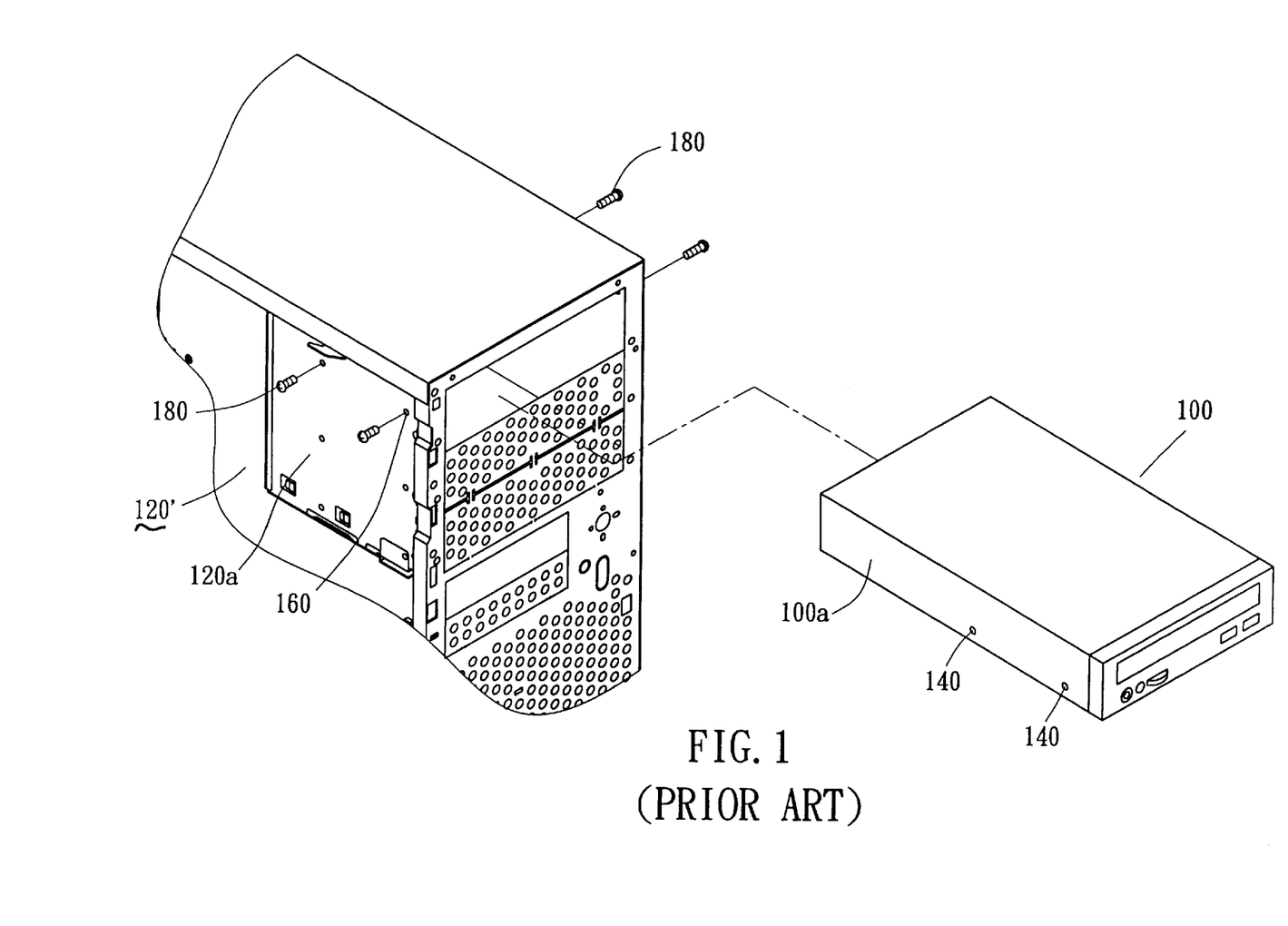
FIG. 1 is an exploded view showing a CD-ROM conventionally attached to a cage of computer housing by means of locking screws.

Conventionally, a hard disk drive, floppy disk drive and CD-ROM are all fixedly attached to a sidewall of a cage by means of locking screws. As shown in FIG. 1, a 5.25" CD-ROM 100 is fixedly attached to the sidewall 120a of the cage 120' by means of a locking screw 180 inserted into a through hole 160 defined in the sidewall 120a and threadedly engaging with a mounting hole 140 defined in a side wall 100a of the the CD-ROM 100. However, when attaching the CD-ROM 100 to the cage 120', the CD-ROM 100 must be supported with one hand in order to align the through holes 160 with the mounting holes 140 which is inconvenient during assembly or maintenance.

Figure 2:
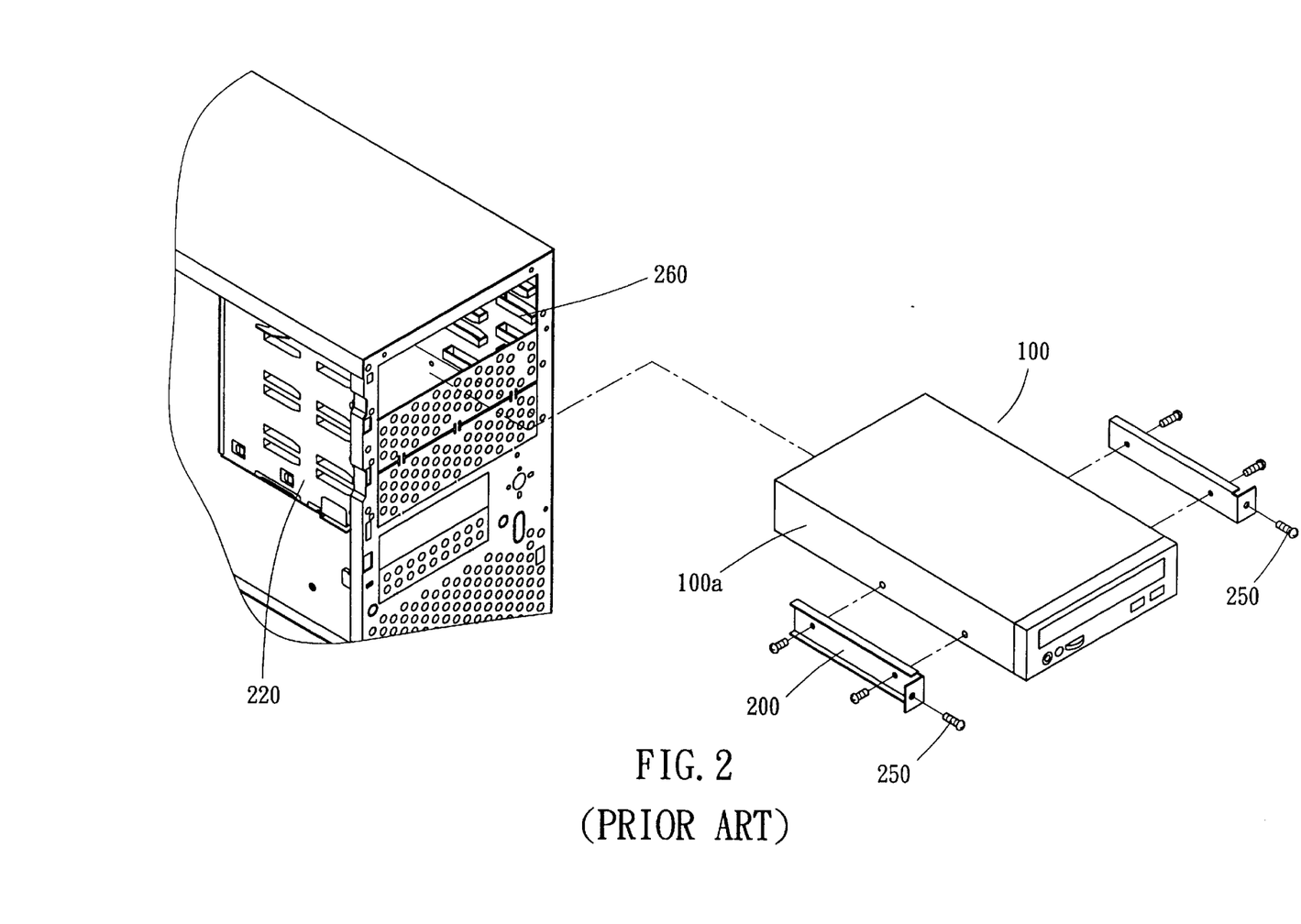
FIG. 2 is an exploded view showing a CD-ROM conventionally attached to a cage of a computer housing by means of guiding rail/groove arrangement.

Referring to FIG. 2, a conventional approach to the existing problem is to provide a guiding rail 200 fixedly attached to each side 100a of the CD-ROM 100, then inserting the CD-ROM 100 together with the guiding rails 200 into a cage 220 of a computer housing through a guiding groove 260 of the cage 220. After the CD-ROM 100 is fully received in the computer housing, locking screws 250 or retaining tabs (not shown) are applied to firmly fix the CD-ROM 100 thereto. Even though this suggestion provides convenience when attaching the CD-ROM 100 to the cage 220, the guiding rails 200 must be firstly attached to the sides 100a of the CD-ROM 100 which complicates the assembly process.

During operation of the disk drives and CD-ROM, static electrical charges will accumulate on the outer surface thereof. If these charges are not quickly discharged or grounded, the operation of the computer may be adversely affected. Therefore, it is essential to provide a suitable grounding path to the outer casing of the data processing device. Even though attaching a CD-ROM or the like to a cage with locking screws or guiding rails/grooves may suitably discharge the build-up of static electrical charges, the assembly thereof is laborious. Furthermore, as the guiding rail 200 is normally made from plastic material, a metal tab for grounding must be included to provide a suitable grounding path. However, the mounting of this metal tab will also complicate the assembly process.

U.S. Pat. Nos. 5,098,175; 5,112,119; 5,142,447; 5,227,954; 5,262,923; 5,332,306; 5,448,538, and 5,510,955 and Taiwan Utility Model Nos. 74208920, 75201460, 75211318, 76201340, 77210426, 78201813, 79209891, 79214335, 79214336, 79214337, 80212451, 82202204, 82207667 and 83208448 disclose prior art related to this field.

SUMMARY OF THE INVENTION

The objective of the present invention is to provide a mounting bracket for a data processing device which facilitates mounting and dismounting of the data processing device to/from a cage of a computer housing.

Another objective of the present invention is to provide a mounting bracket wherein an effective and reliable grounding path is established between a data processing device and a cage of a computer housing.

To fulfill the objectives mentioned above, a mounting bracket for removably attaching a data processing device to a cage of a computer housing in accordance with the present invention, comprises a base plate forming a first sidewall and a second sidewall spaced apart from each other. Both sidewalls extend vertically from transverse sides of the base plate. The first and second sidewalls define a receiving space for receiving a data processing device therein. The first sidewall includes a biasing flange extending horizontally into the receiving space from a free end thereof; and the second sidewall includes at least a biasing tab extending toward the receiving space thereby facilitating installation of the data processing device within the receiving space.

These and additional objects, features, and advantages of the present invention will become apparent after reading the following detailed description of the preferred embodiment of the invention taken in conjunction with the appended drawing.

DETAILED DESCRIPTION OF THE PREFERRED EMBODIMENT

Reference now will be made in detail to the preferred embodiments of the present invention. It is noted here that like parts are designated by the by like numerals throughout the description of the preferred embodiments.

Figure 3:
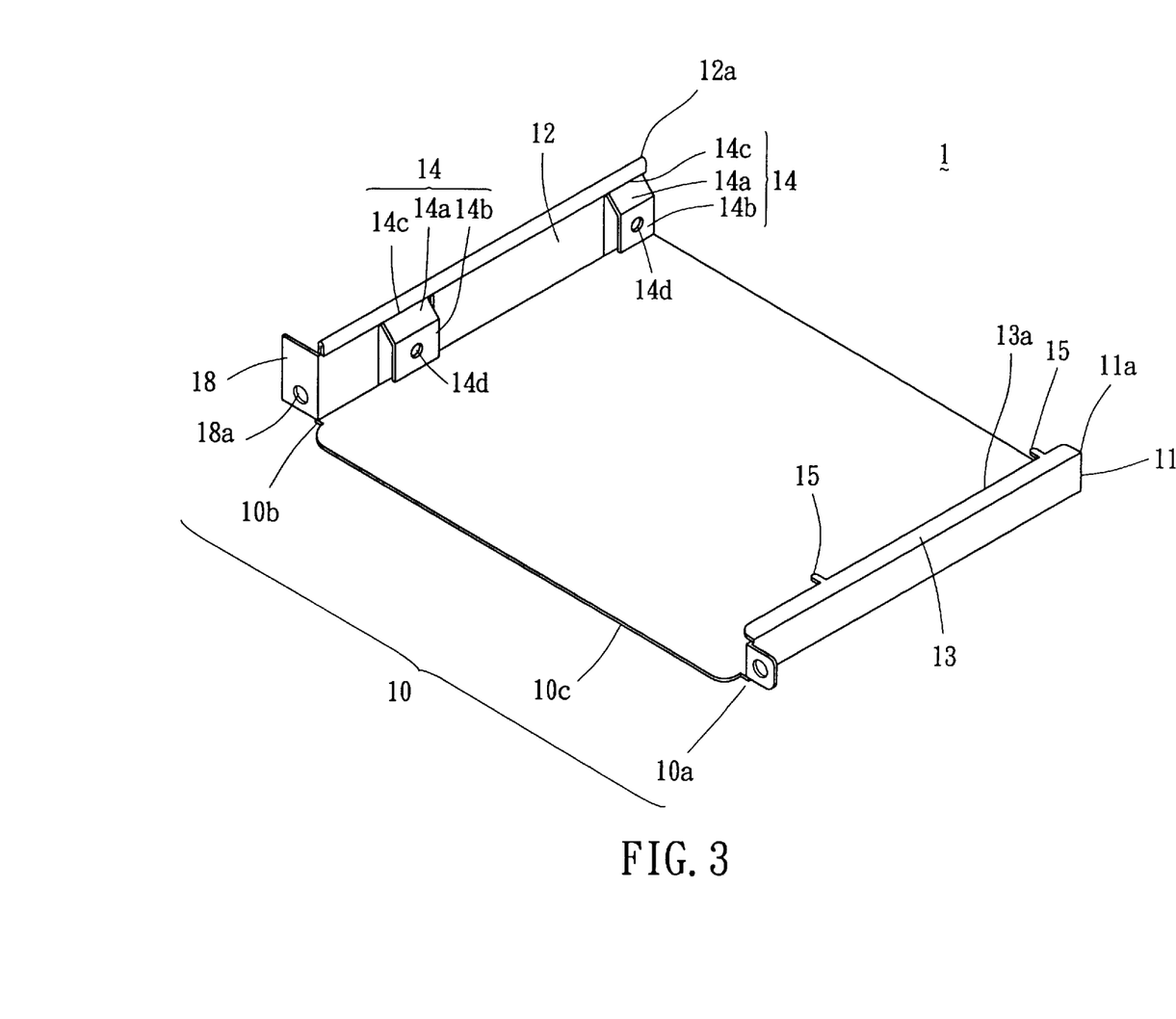
FIG. 3 is a perspective view of a mounting bracket in accordance with the present invention.

Referring to FIG. 3, a mounting bracket 1 in accordance with the present invention generally comprises a base plate 10 having a first sidewall 11 and a second sidewall 12 opposite each other, each extending vertically transverse sides 10a, 10b thereof. The first and second sidewalls 11, 12 define a receiving space (not labeled) for a CD-ROM 20 (shown in FIG. 4) therebetween.

The width of the receiving space is larger than that of the CD-ROM 20 for easy mounting thereof. In order to firmly retain the CD-ROM 20 therein, the first sidewall 11 is provided with a biasing flange 13 extending horizontally from a free end 11a thereof. A free end 13a of the biasing flange 13 is provided with at least a dowel post 15 extending horizontally therefrom. The posts 15 are shaped to establish an interferential engagement with a corresponding hole of the CD-ROM 20. However, in another embodiment, the dowel posts 15 can be replaced with a plurality of barbs to directly establish an interferential fit with an outer wall of the CD-ROM 20.

Figure 4:
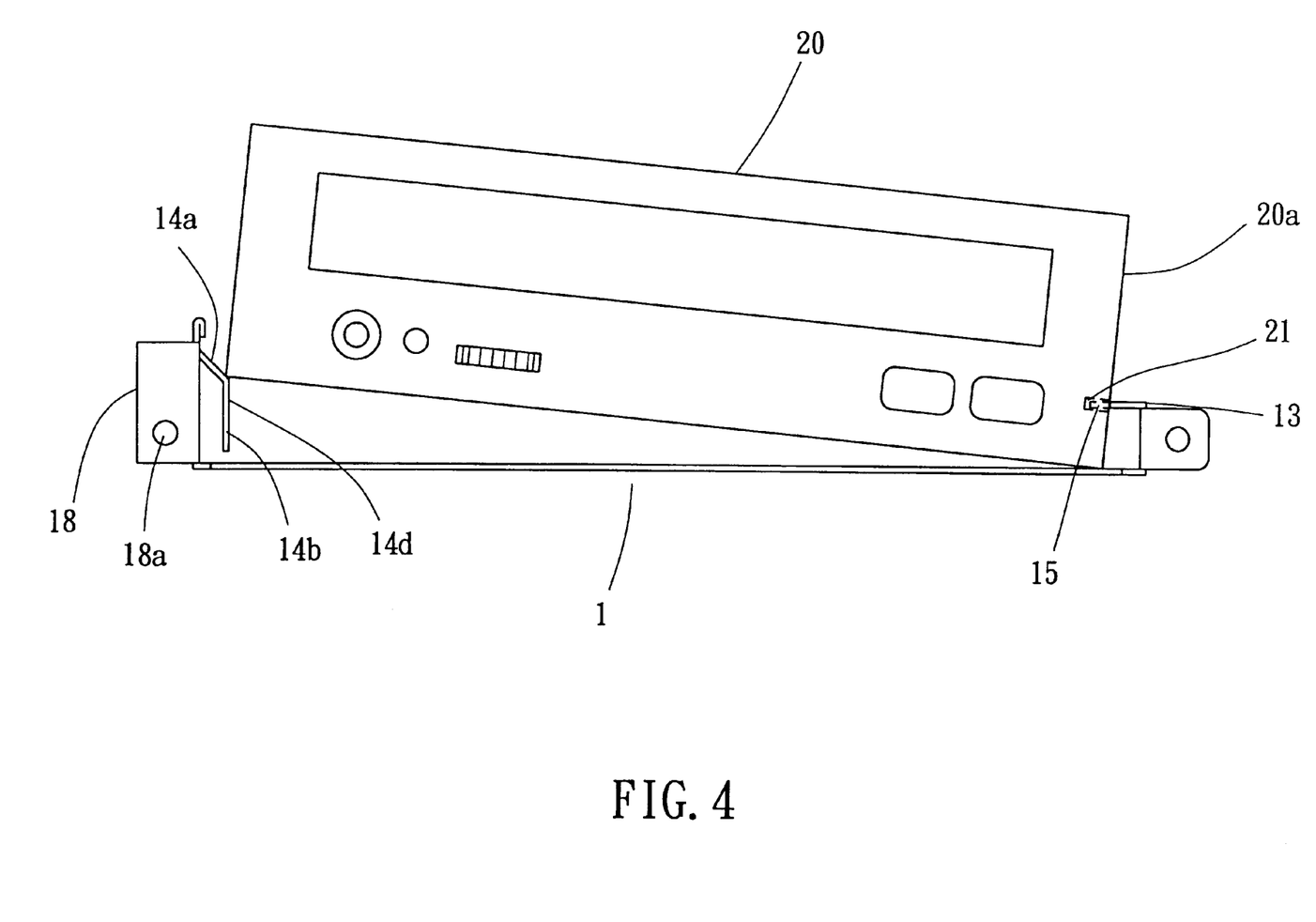
FIG. 4 is a schematic illustration showing a CD-ROM before being mounted onto the mounting bracket.

The second sidewall 12 is formed with a pair of biasing tabs 14 extending toward the receiving space 13. Each biasing tab 14 includes an inclined section 14a and a vertical section 14b parallel to the second sidewall 12. In this embodiment, the biasing tab 14 is cantilevered from a free end 12a of the second sidewall 12 and the vertical section 14b may pivot about a cantilevered end 14c thereof. Accordingly, the receiving space is reduced as the biasing tab 14 extends inward, and the reduced width of the receiving space is slightly smaller than that of the CD-ROM 20, as shown in FIG. 4. By this arrangement, when the CD-ROM 20 is disposed within the receiving space, both outer walls 20a of the CD-ROM 20 can be fully engaged with the dowel post 15 and the biasing tabs 14, respectively.

Figure 5:
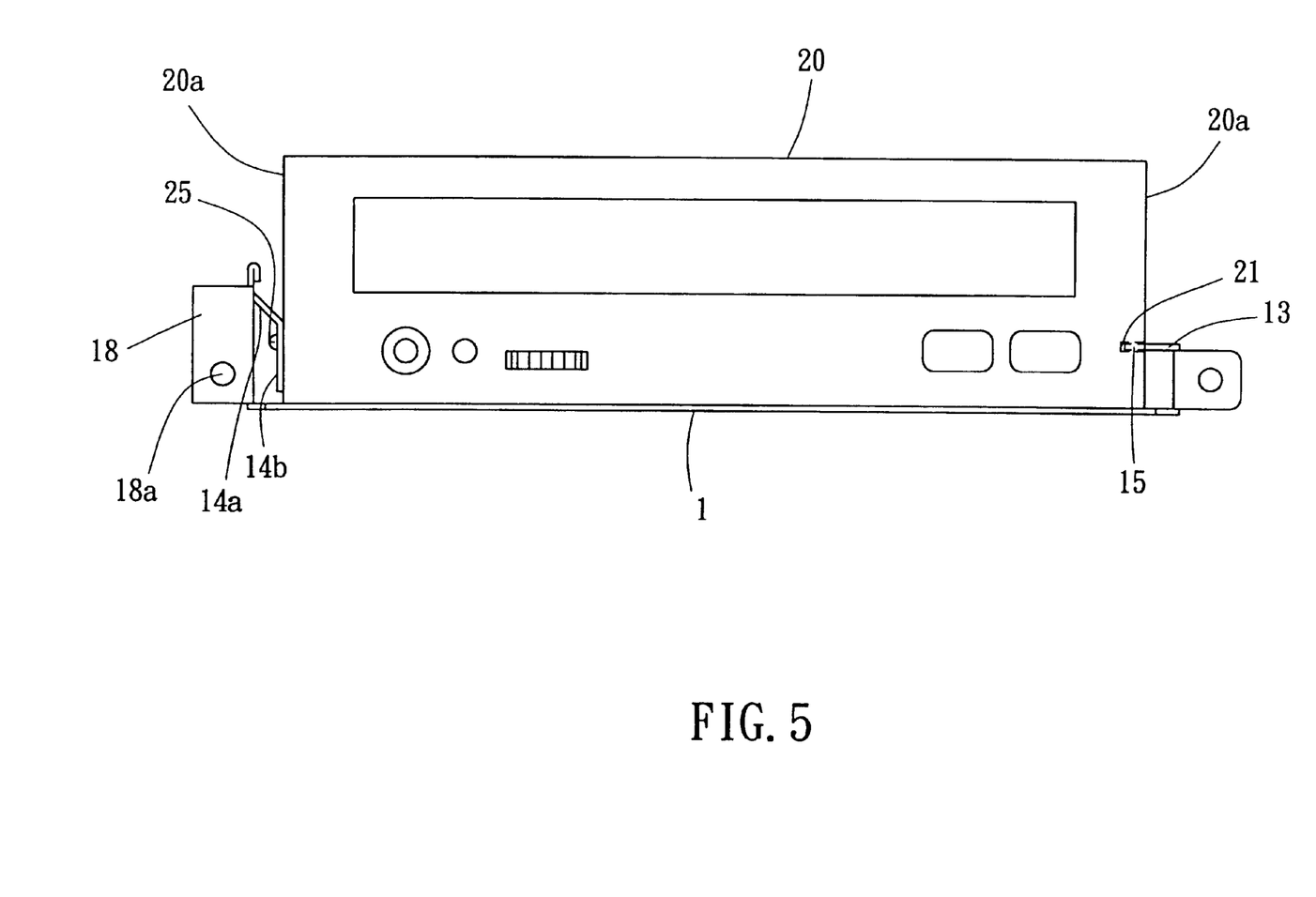
FIG. 5 is a schematic illustration of a CD-ROM after being mounted onto the mounting bracket.

Referring to FIGS. 4 and 5, the vertical section 14b of the biasing tab 14 defines a through hole 14d for receiving a locking screw 25 therein. The CD-ROM 20 defines mounting holes 21 on the outer walls 20a thereof which aligned with the dowel posts 15 and the through holes 14d. By this arrangement, after the CD-ROM 20 is seated on the mounting bracket 1, the biasing tab 14 is pushed outward thereby exerting a biasing force on the outer wall of the CD-ROM 20. The locking screw 25 are then received in the corresponding through holes 14d and threadedly engage with the corresponding mounting holes 21 of the CD-ROM 20. Therefore, a solid engagement between the mounting bracket 1 and the CD-ROM 20 is attained.

Referring back to FIG. 3, the distance between the dowel posts 15 and the through holes 14d are each separated from each other predetermined distance, and the mounting holes 21 of the CD-ROM 20 are also separated from each other the same distance. The provision of the dowel posts 15, the through holes 14d, and the locking screws 25 effectively prevent the CD-ROM 20 from moving longitudinally movement with respect to the mounting bracket 1.

Figure 6:
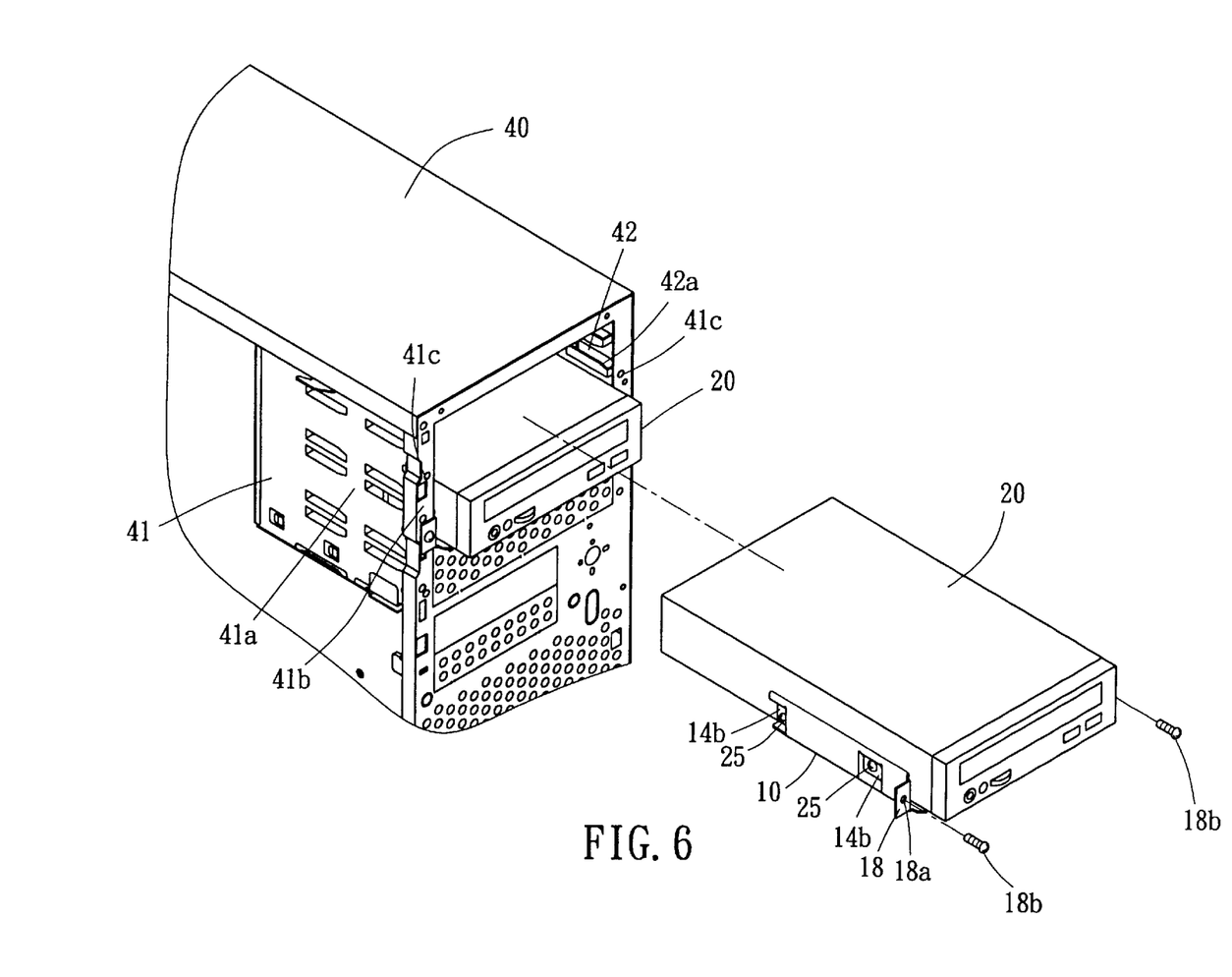
FIG. 6 is a schematic illustration showing a CD-ROM together with the mounting bracket being assembled to a cage of a computer housing.

Referring to FIG. 6, after the mounting bracket 1 is attached to the CD-ROM 20, the sub-assembly is assembled to a cage 41 of a computer housing 40. The cage 41 is provided with a plurality of supporting platforms 42 defined by projections 42a from a sidewall 41a of the cage 41. An underside 10c (shown in FIG. 3) of the mounting bracket 1 is well supported by the supporting platforms 42, therefore the sub-assembly is supported within the cage 41 and must then be firmly engaged therewith to avoid any longitudinal movement therebetween.

There are several ways to achieve this, for example providing an interferential fit between the mounting bracket 1 and the supporting platform 42. However, the interferential fit will make insertion of the sub-assembly difficult. It is advantageous to firstly provide a smooth insert firstly and then provide a firm engagement between the sub-assembly and the cage 41. To this extent, the sidewall 12 of the mounting bracket 1 includes a locking tab 18 defining a locking hole 18a therein. Then a locking bolt 18b can be inserted through the locking hole 18a and engaged with a mounting hole 41c defined in a front portion 41b of the cage 41 to attach the locking tab 18 thereto. By this arrangement, longitudinal movement of the sub-assembly is restricted.

Figure 7:
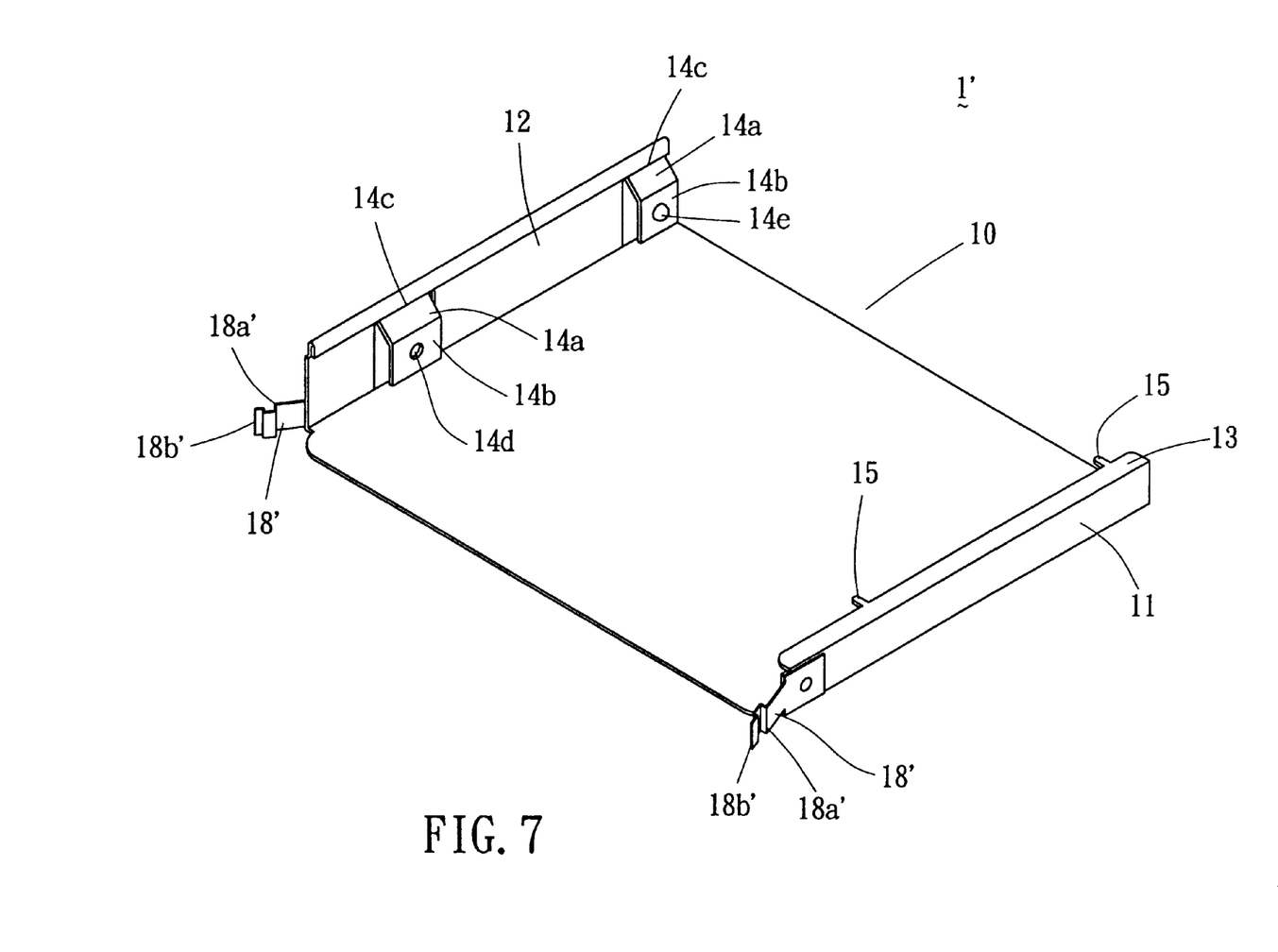
FIG. 7 is a perspective view of a second embodiment of the locking tab of the mounting bracket in accordance with the present invention.
Figure 8:
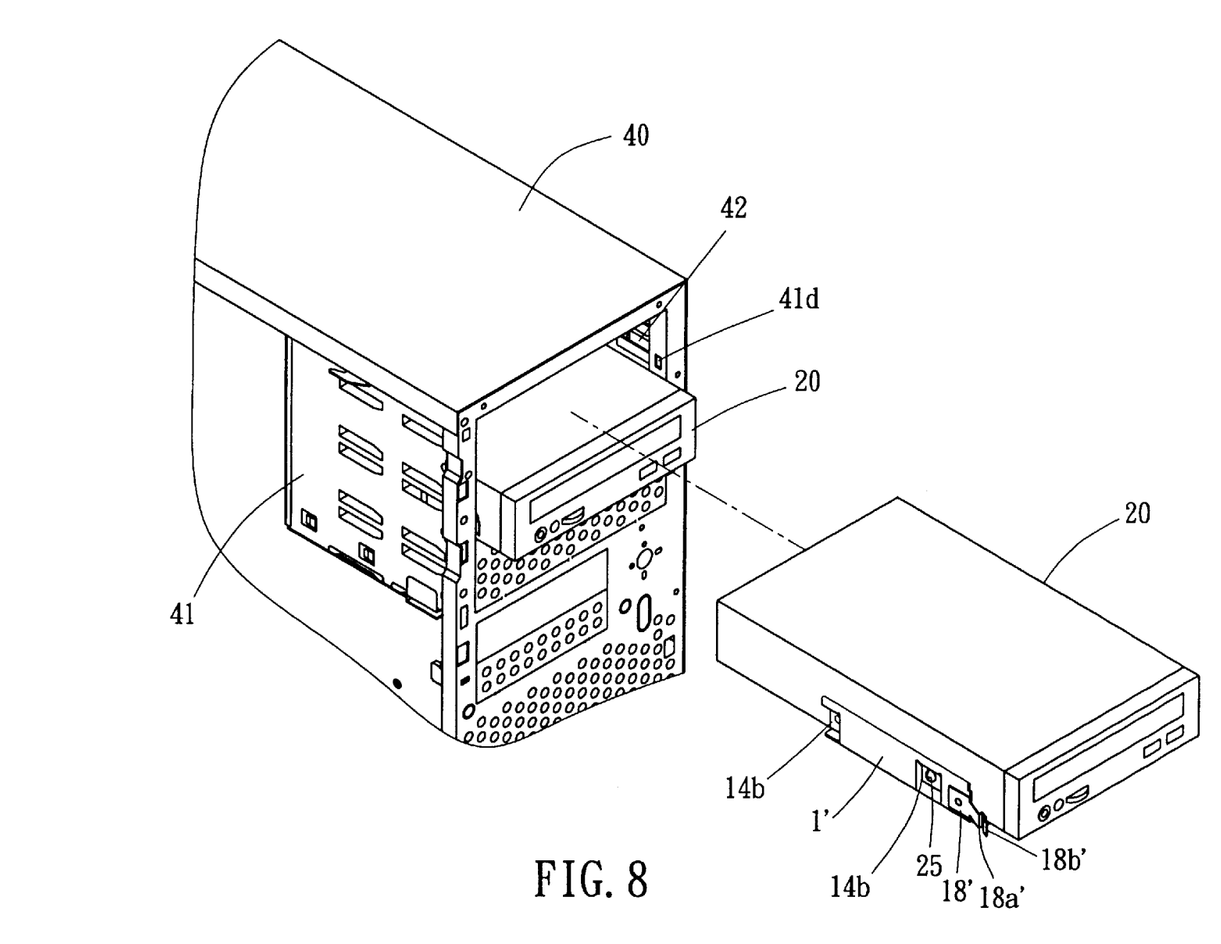
FIG. 8 is a schematic illustration showing the engagement between the cage and the lock tab of FIG. 7.
Figure 9:
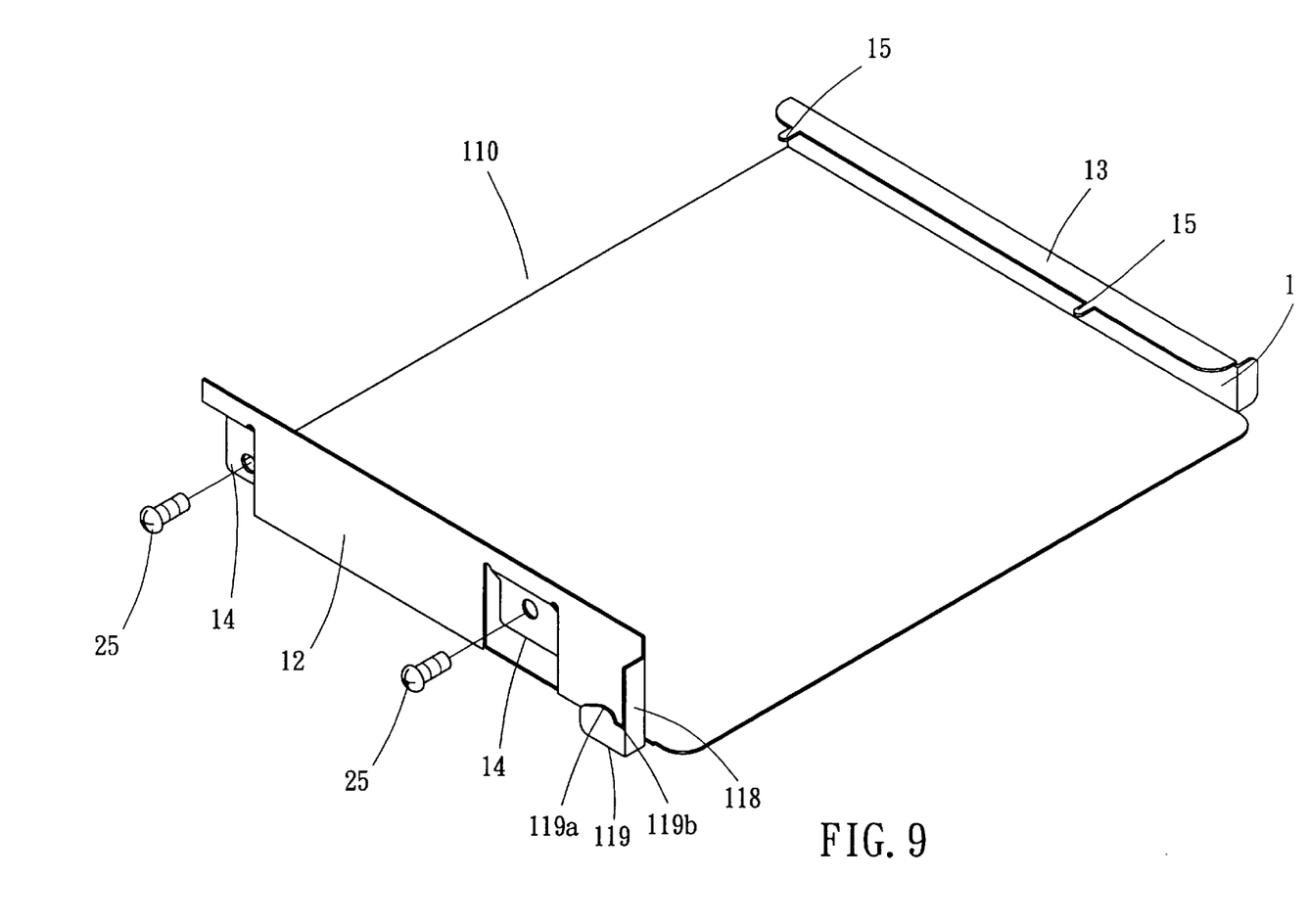
FIG. 9 is a perspective view of a third embodiment of the locking tab of the mounting bracket in accordance with the present invention.

Referring to FIG. 7, the locking tab 18' is embodied to have another shape and extends outward and forward from the sidewalls 11, 12 of the mounting bracket 1'. The locking tab 18' forms a blocking shoulder 18a' and a handling portion 18b'. Referring also to FIG. 8, when the sub-assembly is inserted into the cage 41, the underside 10c of the mounting bracket 1' is well supported by the supporting platforms 42, and the blocking shoulder 18a' is retained within a mounting opening 41d of the cage 41. As a result, longitudinal movement of the sub-assembly within the cage 41 is restricted.

When the sub-assembly is to be removed from the cage 41, the handling portion 18b' can be squeezed inward thereby releasing the blocking shoulder 18a' from the mounting opening 41d and the sub-assembly can be moved outward therefrom.

In this embodiment, the through hole 14d of one of the biasing tabs 14 of the first embodiment is replaced with a retaining bud 14e which can be received within the mounting hole 21 of the CD-ROM 20. Therefore, only one locking screw 25 is required which is especially convenient during assembly. Alternatively, both the through holes 14d of the biasing tabs 14 can be replaced with retaining buds 14e. In this case, no locking screws 25 (FIG. 5) are needed. As a result, the mounting bracket 10 can be quickly and conveniently assembled to the CD-ROM 20.

Referring now to FIG. 9–12, a third embodiment of the mounting bracket 110 is shown. The mounting bracket 110 is similar to the mounting bracket 1 shown in FIG. 3 in all aspects except the locking tab 118. In this embodiment, the attachment of the mounting bracket 110 to the cage 141 of the computer housing 140 is facilitated by locking rod 150. The locking tab 118 includes a lug section 119 extending rearward and parallel to the sidewall 12 of the mounting bracket 110. The lug section 119 has a bump portion 119a and a retaining recess 119b for interlocking with the locking rod 150.

Figure 10A:
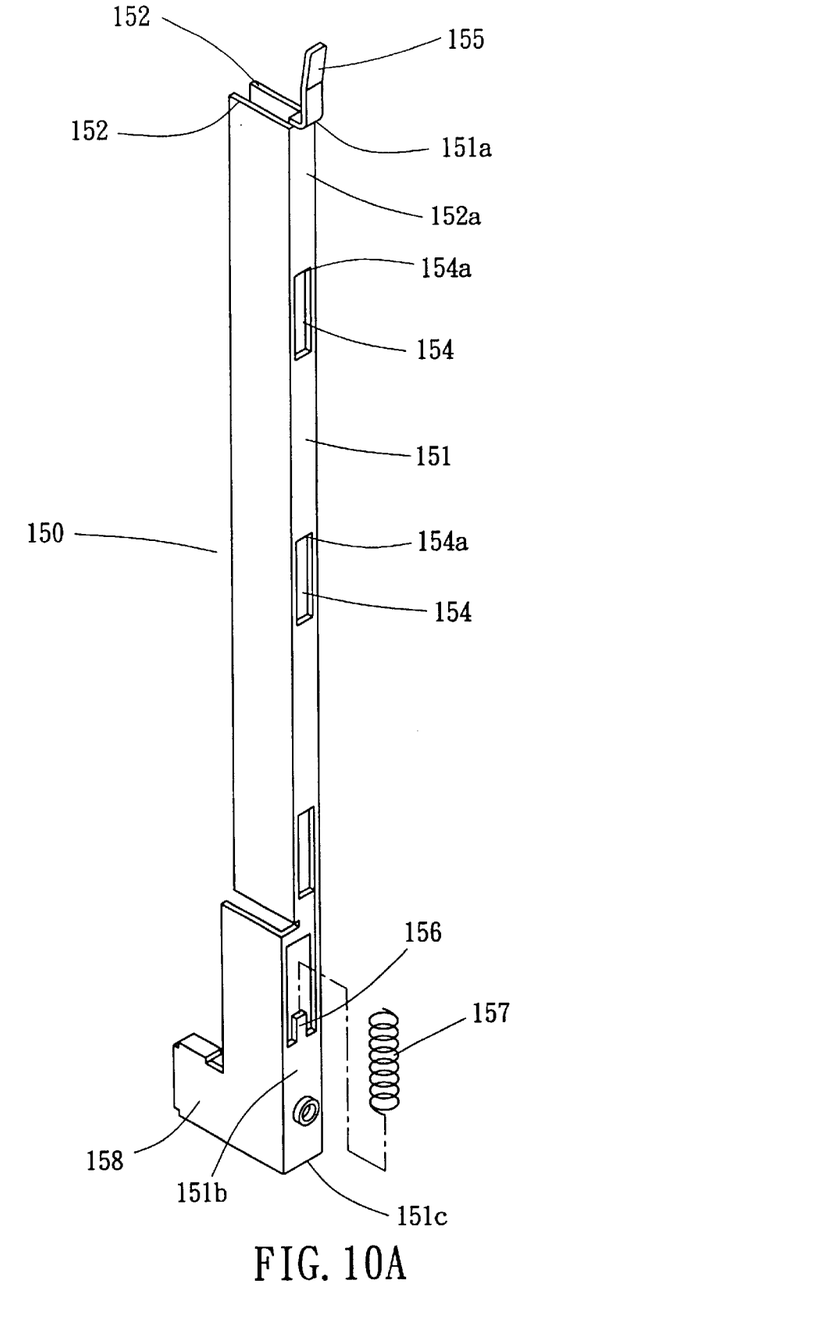
FIG. 10A is a perspective view of a locking rod mounted onto the computer housing.

The locking rod 150 has an elongate body 151 having a U-shaped cross section defining a pair of sidewalls 152 and a bottom section 152a. The bottom section 152a includes a plurality of opening 154. The locking rod 150 includes a mounting tail 155 at an upper portion 151a and a seat 156 for a coil spring 157 at a lower portion 151b. The locking rod 150 further includes a handle section 158 at a bottom end 151c.

Figure 12:
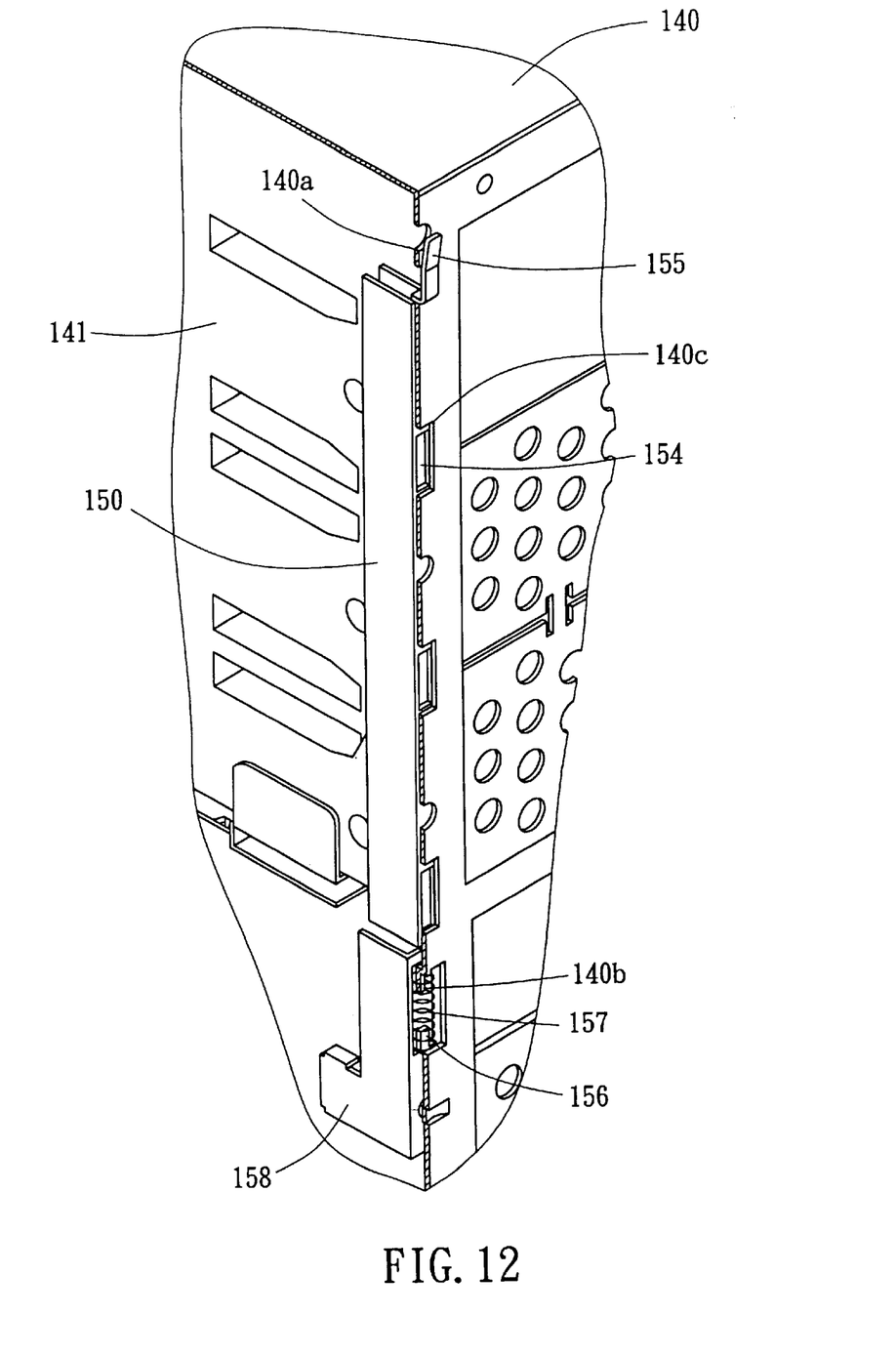
FIG. 12 is a partial cross sectional view showing the attachment between of the locking rod and the cage of the computer housing.

Referring specially to FIG. 12, in order to provide the locking rod 150 with a ground connection, the computer housing 140 includes a mounting tab 140a that is corresponding to the mounting tail 155 of the locking rod 150, and a spring socket 140b for receiving one end of the coil spring 157 of the locking rod 150. The computer housing 140 further includes a plurality of cutouts 140c each aligned with a corresponding opening 154 of the locking rod 150.

Figure 10B:
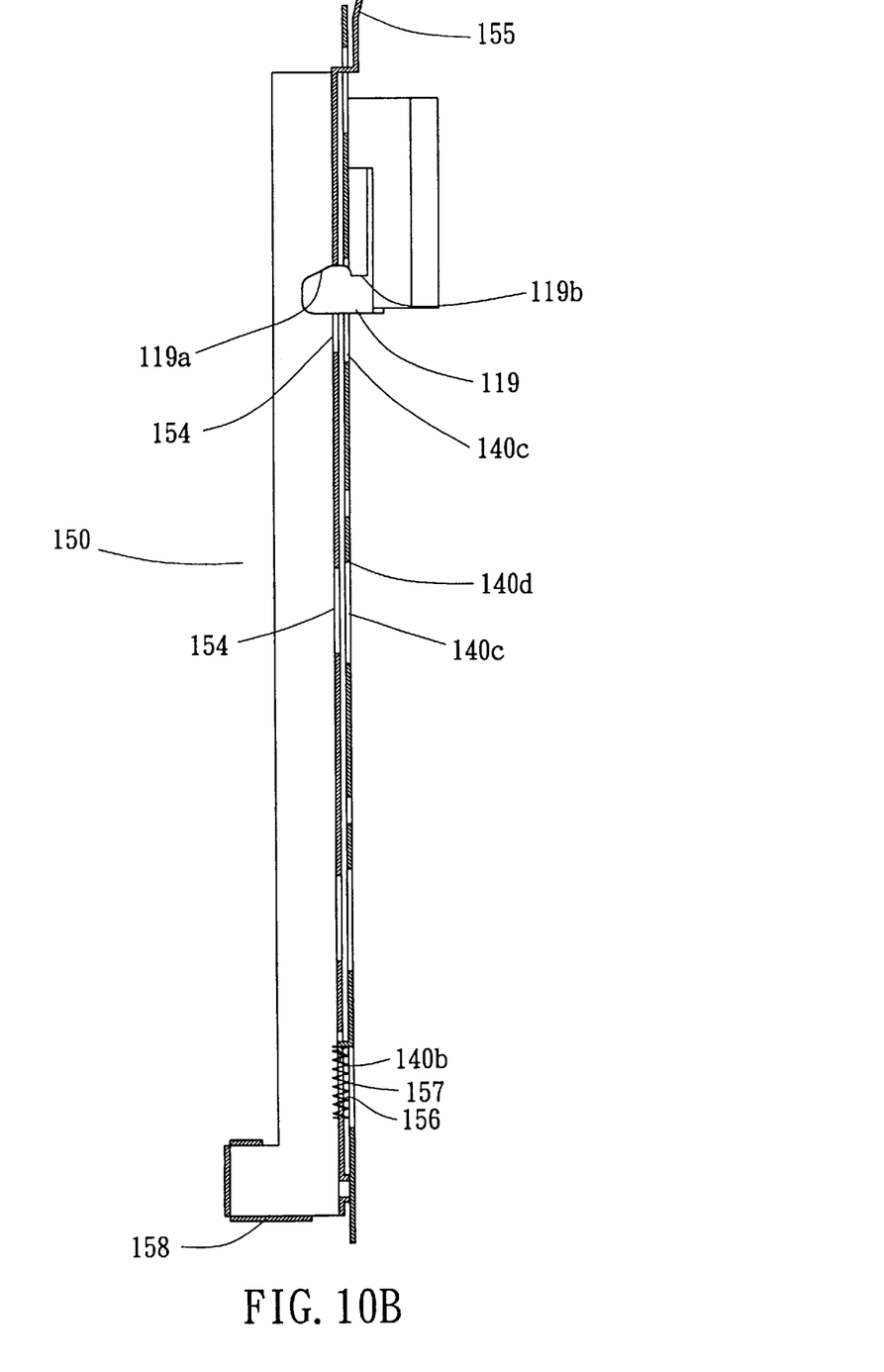
FIG. 10B is a cross sectional view showing the engagement between the locking tab and the locking rod.

As shown in FIG. 10B, the size of each opening 154 of the locking rod 150 is smaller than the corresponding cutout 140c of the computer housing 140 and the upper edge 154a of the opening 154 is lower than the upper edge 140d of the cutout 140c. However, the bump portion 119a can only pass through the opening 154 as the locking rod 150 is lifted upward. Accordingly, when the bump portion 119a pass through the opening 154, the locking rod 150 must be lifted upward via the handle portion 158 to let the bump portion 119a pass therethrough. After the lug portion 119 reaches to its final position and the locking rod 150 resumes its original position, the retaining recess 119b will be retained by the upper edge 154a of the opening 154 thereby restricting the longitudinal movement of the CD-ROM. When the bump portion 119a is to be released from the opening 154, the locking rod 150 must be lifted again to let the bump portion 119a pass therethrough.

Figure 11:
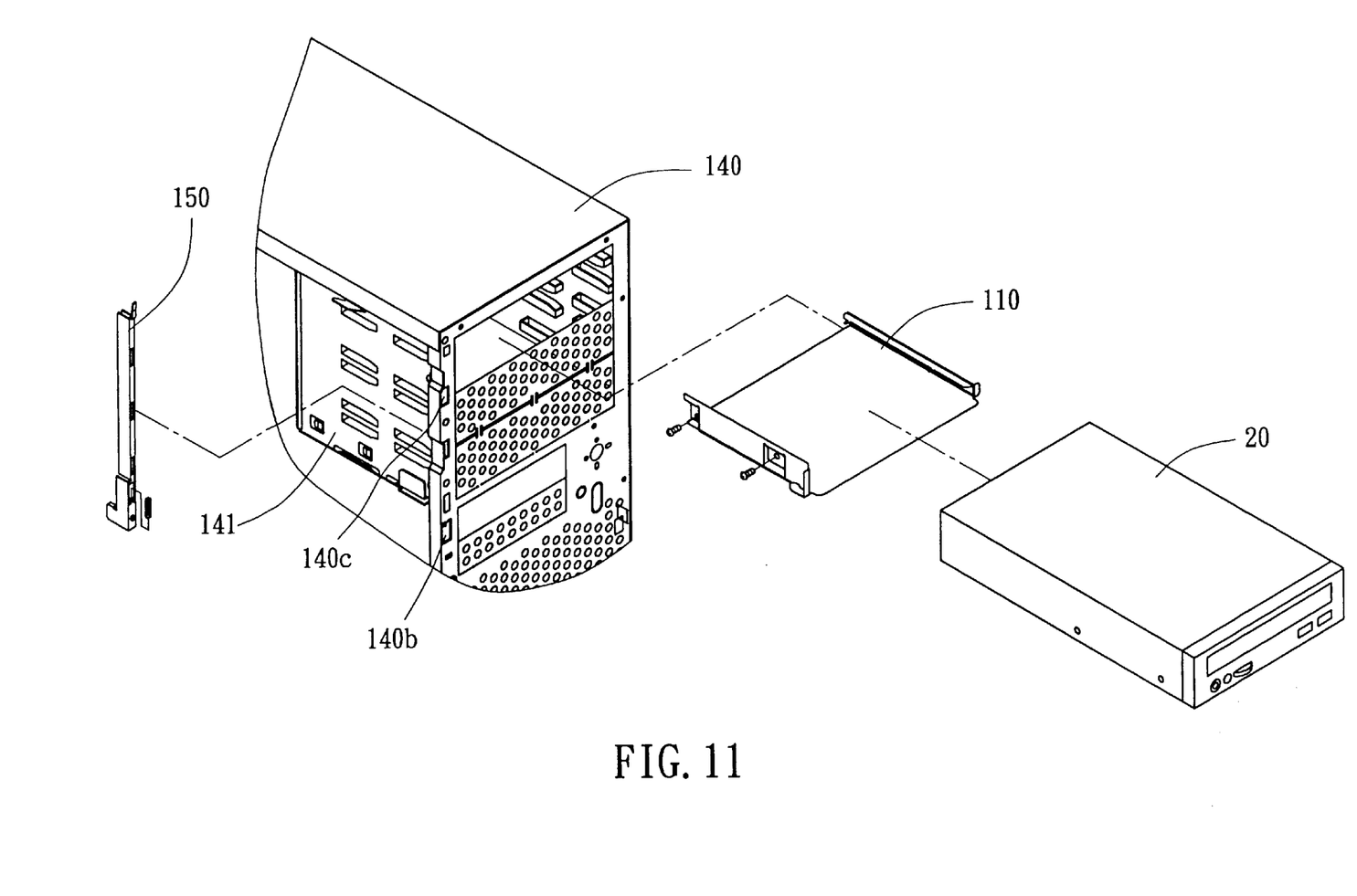
FIG. 11 is a schematic illustration of a CD-ROM being assembled to the cage by means of the locking rod and the mounting bracket.

FIG. 11 is an exploded view showing the mounting bracket 110, CD-ROM 120, and computer housing 140 having a locking rod 150 before assembly. FIG. 12 is a partial view of the computer housing 140 showing the locking rod 150 movably attached thereto for facilitating the attachment of the CD-ROM 120.

While the present invention has been described with reference to specific embodiments, the description is illustrative of the invention and is not to be construed as limiting the invention. Various modifications to the present invention can be made to the preferred embodiments by those skilled in the art without departing from the true spirit and scope of the invention as defined by the appended claims.

Therefore, persons of ordinary skill in this field are to understand that all such equivalent structures are to be included within the scope of the following claims.

What is claimed is:

1. A mounting bracket for removably attaching a data processing device to a cage of a computer housing, comprising:

a base plate forming a first sidewall and a second sidewall spaced apart from said first sidewall, said first and second sidewalls defining a receiving space for receiving said data processing device therein;

said first sidewall including a biasing flange extending horizontally into said receiving space from a free end thereof; and said second sidewall including at least a biasing tab extending toward said receiving space, said biasing tab including an inclined section and a vertical section parallel to said second sidewall thereby facilitating installation of said data processing device within said receiving space.

2. A mounting bracket as recited in claim 1, wherein said biasing tab is cantilevered from a free end of said second sidewall.

3. A mounting bracket as recited in claim 1, wherein said vertical section further defines a through hole.

4. A mounting bracket as recited in claim 1, wherein said vertical section includes a retaining bud for releasable engagement with a mounting hole of said data processing device.

5. A mounting bracket as recited in claim 1, wherein said biasing flange includes at least a dowel post extending toward said receiving space for releasably engaging with a mounting hole of said data processing device.

6. A mounting bracket as recited in claim 1, wherein at least one of said sidewalls includes a locking tab transversally extending from a front end thereof for detachably engaging with a portion of said cage of said computer housing.

7. A mounting bracket as recited in claim 6, wherein said locking tab defines a through hole for facilitating an interlocking engagement with said cage by means of a locking screw.

8. A mounting bracket as recited in claim 6, wherein said locking tab further includes a lug section extending rearward and parallel to said sidewall.

9. A mounting bracket as recited in claim 8, wherein said lug section includes a bump portion.

10. A computer housing assembly, comprising:

a cage section forming a plurality of sidewalls opposite each other, each said sidewall including a plurality of projections each defining a supporting platform; and a mounting bracket removably attaching a data processing device to said cage by engaging with said supporting platforms, comprising:

a base plate forming a first sidewall and a second sidewall spaced apart from said first sidewall, said first and second sidewalls defining a receiving space for receiving said data processing device therein;

said first sidewall including a biasing flange extending horizontally into said receiving space from a free end thereof thereby abutting against a first outer wall of said data processing device; and said second sidewall including at least a biasing tab extending toward said receiving space for abutting against an opposite second outer wall of said data processing device thereby facilitating installation of said data processing device within said receiving space.

11. A computer housing having a cage section, the housing further including:

a mounting bracket for removably attaching a data processing device to said cage section including a base plate forming a first sidewall and a second sidewall spaced apart from said first sidewall, said first and second sidewalls defining a receiving space for receiving said data processing device therein, said first sidewall including a biasing flange extending horizontally into said receiving space from a free end thereof for abutting against a first outer wall of said data processing device, and said second sidewall including at least a biasing tab extending toward said receiving space for abutting against an opposite second outer wall of said data processing device, at least one of said sidewalls including a locking tab transversally extending from a front end thereof for detachably engaging with a portion of said cage of said computer housing; and a locking rod removably attached to said cage for releasably engaging with said locking tab.

12. The computer housing as recited in claim 11, wherein said locking rod comprises:

an elongate body having a U-shaped cross section defining a pair of sidewalls and a bottom section forming a plurality of openings for releasably engaging with a bump portion of said mounting bracket thereof;

a mounting tail located at a first end of said body;

a seat for coil spring at a lower portion of said body; and a handle section at another end opposite said first end.

13. The computer housing as recited in claim 11, wherein said locking tab extends flexibly outward and forward from each said sidewall, said locking tab defining a blocking shoulder for releasably engaging with a portion of said cage, and a handling portion for manipulating the engagement and engagement with respect to said cage.

14. A mounting bracket removably attaching a data processing device to a cage of a computer housing, comprising:

a base plate forming a first sidewall and a second sidewall spaced apart from said first sidewall, said first and second sidewalls defining a receiving space for receiving said data processing device therein;

said first sidewall including a biasing flange extending horizontally into said receiving space from a free end thereof and abutting against a first outer wall of said data processing device; and said second sidewall including at least a biasing tab extending toward said receiving space and abutting against an opposite second outer wall of said data processing device thereby facilitating installation of said data processing device within said receiving space.

15. A mounting bracket for removably attaching a data processing device to a cage of a computer housing, comprising:

a base plate forming a first sidewall and a second side wall spaced apart from said first sidewall, said first and second sidewall defining a receiving space for receiving said data processing device therein;

said first sidewall including a biasing flange extending horizontally into said receiving space from a free end thereof; and said second sidewall including at least a biasing tab extending toward said receiving space, thereby facilitating installation of said data processing device within said receiving space; wherein said biasing flange includes at least a dowel post extending toward said receiving space for releasably engaging with a mounting hole of said data processing device.

* * * * *